United States Patent
Ricci et al.

(10) Patent No.: US 8,373,998 B2
(45) Date of Patent: Feb. 12, 2013

(54) RESISTOR SHIELD TO MINIMIZE CROSSTALK AND POWER SUPPLY INTERFERENCE

(75) Inventors: Marc A. Ricci, Victoria (CA); Jonathan Knoll, Victoria (CA)

(73) Assignee: Schneider Electric USA, Inc., Palatine, IL (US)

( * ) Notice: Subject to any disclaimer, the term of this patent is extended or adjusted under 35 U.S.C. 154(b) by 318 days.

(21) Appl. No.: 12/892,306

(22) Filed: Sep. 28, 2010

(65) Prior Publication Data

US 2012/0075827 A1 Mar. 29, 2012

(51) Int. Cl.
*H05K 7/14* (2006.01)
*H05K 7/18* (2006.01)

(52) U.S. Cl. ......... 361/800; 361/799; 361/816; 361/818

(58) Field of Classification Search .......... 361/799–800, 361/816–818
See application file for complete search history.

(56) References Cited

U.S. PATENT DOCUMENTS

| | | | | |
|---|---|---|---|---|
| 4,620,265 | A | * | 10/1986 | Lerude et al. ................. 361/816 |
| 4,689,825 | A | * | 8/1987 | Geiger et al. ................. 455/347 |
| 5,142,268 | A | | 8/1992 | Clark et al. |
| 6,154,361 | A | * | 11/2000 | Anderson et al. ........ 361/679.34 |
| 6,538,902 | B1 | * | 3/2003 | Beard ............................ 361/818 |
| 7,400,410 | B2 | * | 7/2008 | Baker et al. .................... 356/498 |
| 2003/0103341 | A1 | * | 6/2003 | Wakamori .................... 361/816 |

FOREIGN PATENT DOCUMENTS

GB 2261998 A 6/1993

OTHER PUBLICATIONS

Written Opinion corresponding to co-pending International Patent Application Serial No. PCT/US2011/053198, European Patent Office, dated Nov. 11, 2011; (4 pages).
International Search Report corresponding to co-pending International Patent Application Serial No. PCT/US2011/053198, European Patent Office, dated Nov. 11, 2011; (5 pages).

* cited by examiner

*Primary Examiner* — Tuan T Dinh
(74) *Attorney, Agent, or Firm* — Nixon Peabody LLP

(57) ABSTRACT

A shield that protects high-value input resistors in a power meter against unwanted effects due to electromagnetic interference from a nearby power supply and/or due to crosstalk from adjacent phases. The shield includes multiple printed circuit board shields that are arranged between each of the input resistors on a main printed circuit board in the power meter. Each PCB shield has a conductive layer that provides the shielding against unwanted energy. The resistors are arranged in a diagonal or parallel manner between each pair of PCB shields to prevent the resistor from movement, which prevents pin fatigue and fixes the value of the parasitic capacitance that is produced in the resistor-PCB-shield combination. In another configuration, the PCB shield is made of a flexible material, and snakes between and over the top or around the side ends of each resistor in a serpentine fashion, protecting the resistors from unwanted energies from both the top and the sides. The PCB shields disclosed herein eliminate variations in the percent error of the measurement phases, which contributes to achieving a highly accurate meter with an overall accuracy of less than 0.1%.

16 Claims, 6 Drawing Sheets

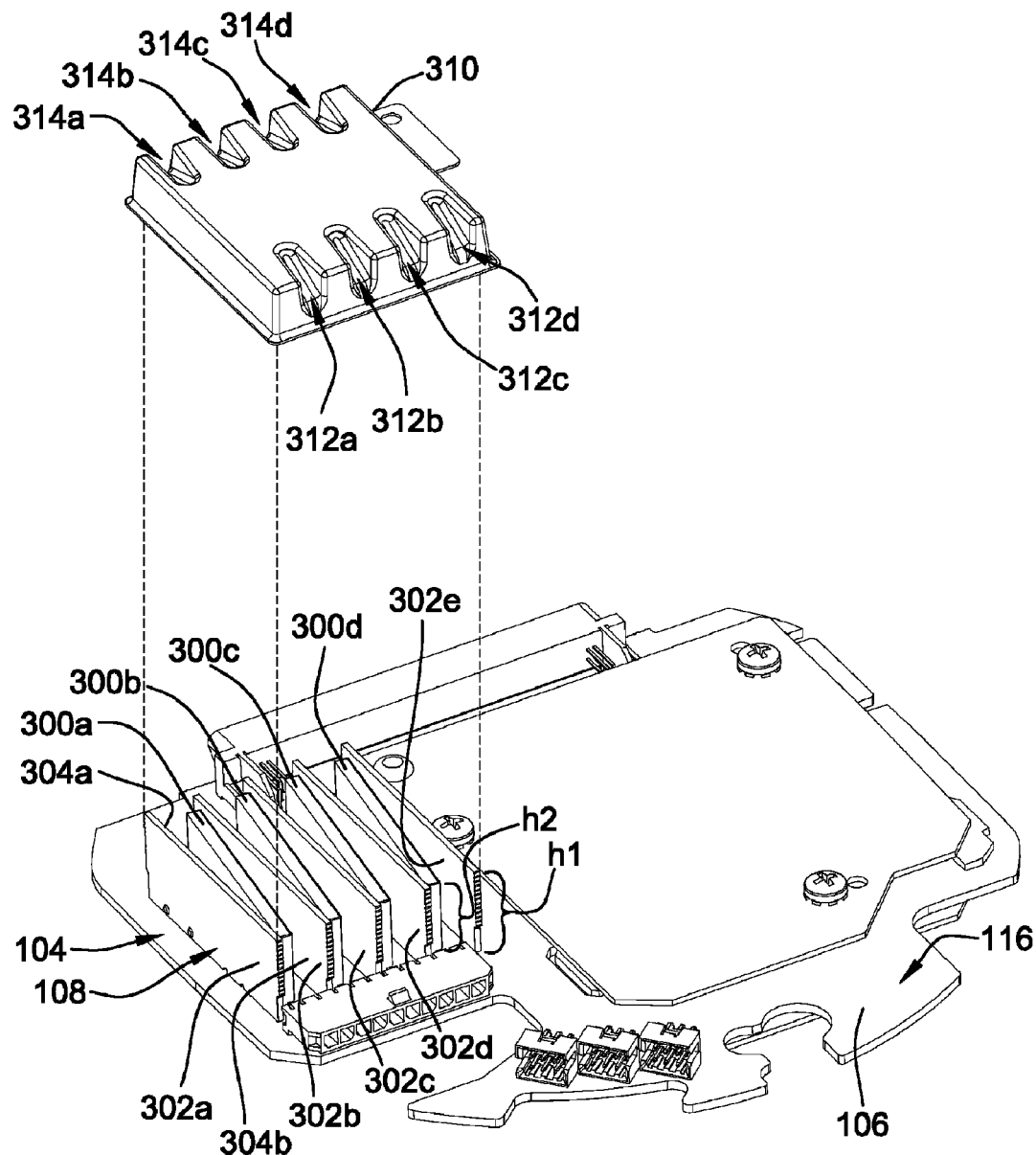
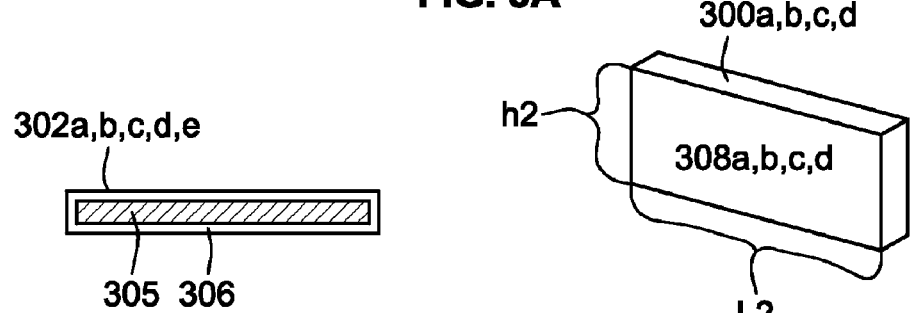
FIG. 3A
FIG. 3A-1
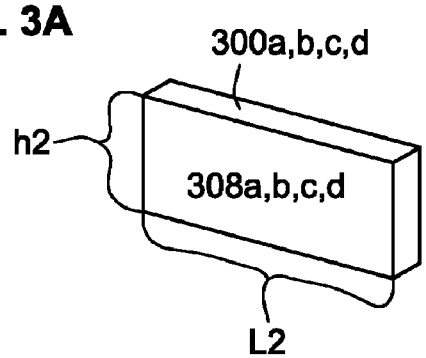
FIG. 3A-2

RESISTOR SHIELD TO MINIMIZE CROSSTALK AND POWER SUPPLY INTERFERENCE

FIELD OF THE INVENTION

The present disclosure relates generally to electronic component shielding, and, more particularly, to a printed circuit board shield assembly to shield resistors against crosstalk and interference due to electromagnetic energy produced by nearby electronic components.

BACKGROUND

In a compact power meter, the power supply components include large capacitors, transformers, and other electronic components for converting the high-power inputs to the power meter into smaller voltages sufficient to power the sensitive electronics within the power meter. These power supply components can generate a significant amount of interference in the form of electromagnetic energy. This electromagnetic interference or EMI can adversely affect the performance of other circuits located near the power supply. Moreover, in power meters that receive multiple phases of voltage or current, the inputs are typically located right next to each other and are susceptible to crosstalk interference, where current flowing through one conductor carrying one phase of electricity can create electric and/or magnetic fields that interfere with signals passing through an adjacent conductor carrying a different phase. The overall effect of EMI interference and crosstalk interference is a degradation in the quality of the signals that are converted into corresponding digital values, resulting in a less accurate power meter. The more these original signals are degraded by interference, the less accurate the meter readings will be. The overall accuracy of a meter is expressed in terms of percent error, which is the minimum acceptable deviation by a measured voltage from the original voltage. Existing meters are typically designed to meet or exceed a percent error of 0.2% or less, but there is a need for a meter having a percent error of 0.1% or less. Aspects of the present disclosure are intended to satisfy this and other needs.

BRIEF SUMMARY

A highly accurate power meter is achieved by reducing the effects of external influences such as EMI due to high-power components in the meter's power supply and the effects of crosstalk from adjacent phase inputs to the power meter. To do so, aspects of the present disclosure propose to insert a shield composed of one or more shielded printed circuit boards (PCBs) having a conductive material inside the rigid or flexible printed circuit boards such that the shield exists in a path of the electromagnetic energy produced by the power supply and energy from crosstalk signals in adjacent phases. In an exemplary configuration, four resistors are disposed on a main printed circuit board inside a housing of the power meter. A PCB shield is placed between each of the four resistors and one PCB shield is placed on either side of the outermost resistors. The power supply is disposed on a circuit board that is placed near (such as above) the main PCB, such that electromagnetic energy produced by high-power components of the power supply will create field lines, the strongest of which will tend to run generally across the surface of the main PCB and couple with the exposed voltage input resistors. Without a PCB shield, these fields would couple directly with the voltage signals passing through the input resistors, interfering with these signals and causing variability in the measurements. By inserting a PCB shield between each resistor and opposite the outermost resistors, a barrier is created to the electromagnetic fields produced by the power supply or other nearby electronic components, shielding the resistors from their effects. Though some fields may couple over the tops of the resistors, these fields are much weaker and can be ignored. However, an optional cover can be placed over the PCB shields and corresponding resistors to protect the resistors. The cover can also include a conductive material to provide further shielding over the tops of the resistors.

A resistor sandwiched between two grounded PCB shields can look and behave like a capacitor, creating further unwanted effects on the input signals being measured by the power meter. Aspects of the present disclosure propose to angle the resistors so that they are diagonally spaced between adjacent pairs of PCB shields, forming a N-shape via each resistor and pair of PCB shields. This locks the resistor in place, which serves two purposes: First, it prevents the resistor pins from being flexed and avoids weakening of the resistor pins. Secondly, it fixes the distance between the PCB shield and the resistor, so that any parasitic capacitance created between the resistor and PCB shields will be of a fixed value, which can then be compensated for. Alternately, the resistors can be oriented so that they are parallel with adjacent sides of the PCB shields providing the components are fixed and supported to maintain consistent spacing.

In another configuration, the PCB shield is composed of flexible materials, sometimes called a flex-PCB, with a flexible conductive material inside the dielectric material of the flex-PCB. In this configuration, the PCB shield is snaked over and between each resistor in a serpentine fashion to provide a shield both over and surrounding both sides of each resistor. This configuration protects each resistor from electromagnetic energy and energy due to crosstalk from both sides and from the tops of each resistor. The main PCB itself forms a barrier to any unwanted energy (e.g., EMI or crosstalk) passing through the main PCB, so it is not necessary to shield the bottoms of each resistor, as they should be generally well-shielded against this unwanted energy. No cover is proposed in this configuration, though one is not precluded either.

The present disclosure without any further modifications to an existing power meter reduces the variability in the voltage input measurements from within 0.05% to less than 0.005%. Power meters using the aspects of the present disclosure will be poised to not merely satisfy but far exceed any applicable regulations, codes, or standards.

The foregoing and additional aspects and implementations of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the present disclosure will become apparent upon reading the following detailed description and upon reference to the drawings.

FIG. 3A is a perspective view of a top surface of the main printed circuit board shown in FIG. 1;

FIG. 3A-1 is a cross-sectional representation (not to scale) of one of the PCB shields shown in FIG. 3A;

FIG. 3A-2 is a perspective representation (not to scale) of one of the resistors shown in FIG. 3A;

DETAILED DESCRIPTION

Figure 1:
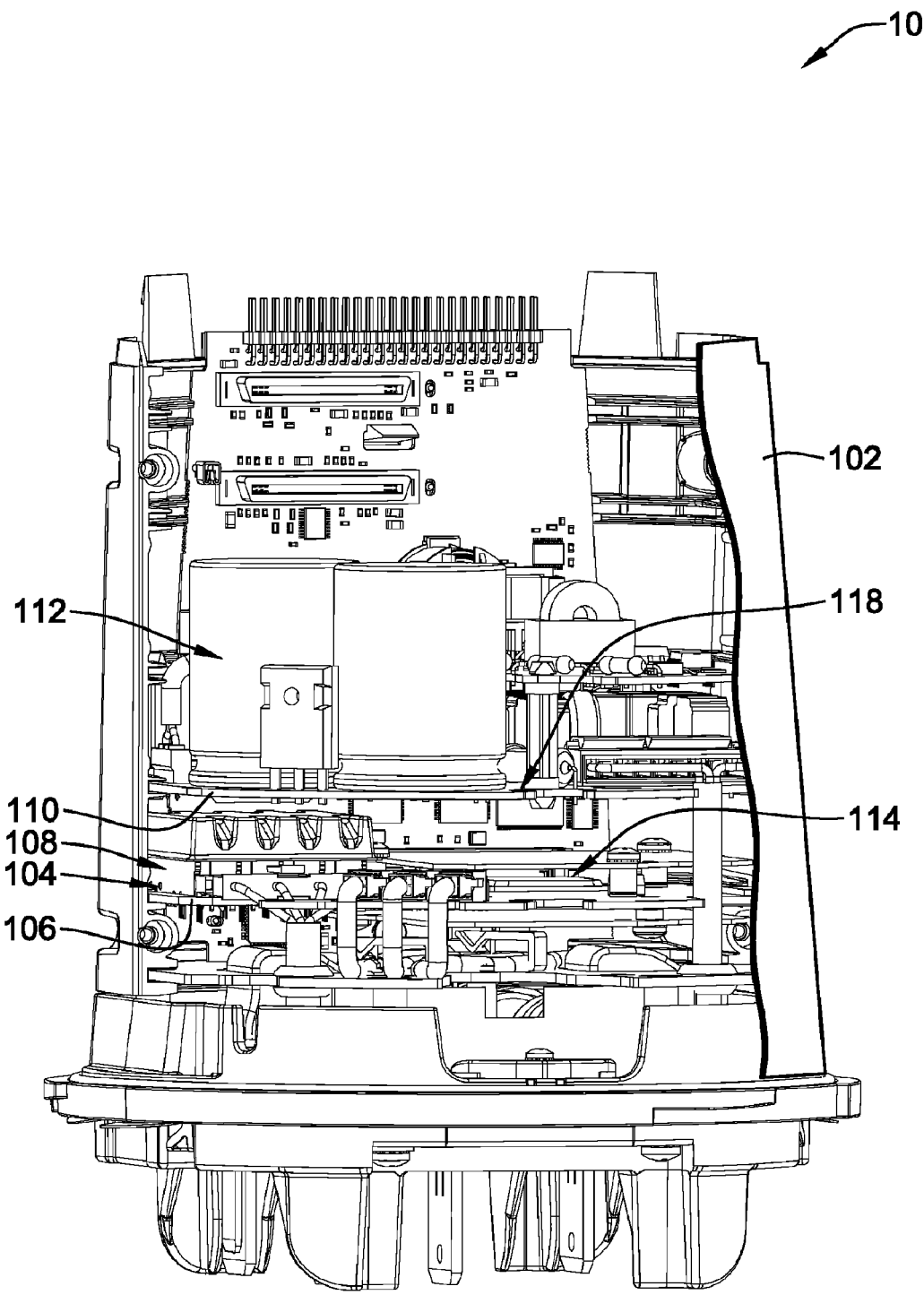
FIG. 1 is a cut-away perspective view of a power meter with its housing removed to reveal a printed circuit board (PCB) assembly according to aspects of the present disclosure on a main PCB in a stacked relationship with a second PCB that includes the power meter's power supply.

FIG. 1 is an illustration of a power meter 100 with part of its housing 102 removed to reveal electronic components within the housing 102. A printed circuit board assembly 104 is shown within the housing 102. The printed circuit board assembly 104 includes a main printed circuit board (PCB) 106 and a PCB shield assembly 108. A second circuit board 110 within the housing 102 includes a power supply 112, which powers electronic components 114 on the main PCB 106. The power supply 112 is arranged within the housing 102 in a stacked relationship relative to the main PCB 106. A major flat surface 118 of the second PCB 110 is parallel to a major flat surface 116 (see FIG. 3A) of the main PCB 106, as can be seen in FIG. 1. In this stacked configuration, the field lines of electromagnetic energy produced by high-power components in the power supply 112, which conventionally includes capacitors, transformers, and rectifiers, will tend to emanate away from the power supply 112 and then curve back toward the main PCB 106, creating field lines that run across the major surface 116 of the main PCB 106. Similarly, energy due to crosstalk interference will emanate from one resistor to another due to their proximity to one another on the main PCB 106. The PCB shield assembly 108 blocks these unwanted energies from affecting the voltages (or currents) as they travel from the inputs of the power meter 100 to electronic components on the main PCB 106. Although the illustrated example shows the second PCB 110 in a stacked, parallel relationship with the main PCB 106, in other configurations the power supply 112 and the main PCB 106 can be located relative to one another in other relationships, such as co-planar or in a staggered relationship. The PCB shield assembly 108 should be arranged on the main PCB 106 to block the strongest field lines in unwanted electromagnetic energy produced by the power supply 112 and/or in unwanted crosstalk interference between adjacent inputs to the power meter 100.

The printed circuit board assembly 104 includes at least one high-value precision resistor 300a (see FIG. 3A) disposed on the main printed circuit board 106 and electrically coupled to a corresponding input 200a (see FIG. 2) to the power meter 100. The first input 200a carries a current or a voltage measured by the power meter 100. In the illustrated examples, the power meter 100 measures voltages, but in other configurations contemplated by the present disclosure, the power meter 100 can measure current or both current and voltage. In FIG. 3A, four high-value precision resistors 300a-d are shown, but the present disclosure is intended to cover at least one high-value precision resistor, even though four are shown in the illustrated examples. The high-value precision resistors 300a-d have a very high value, for example on the order of mega-ohms, and in the illustrated example shown in FIG. 3A, can have a rectangular shape, though the present disclosure is not limited to any particular form factor for the resistors. The resistors 300a-d are capable of ranging the line input voltage, such as on the order of 240V or 480V nominal, to a level that is acceptable for input into an analog-to-digital (A/D) converter (ADC) 202 (shown in FIG. 2), such as on the order of millivolts or less than 5V.

Figure 3B:
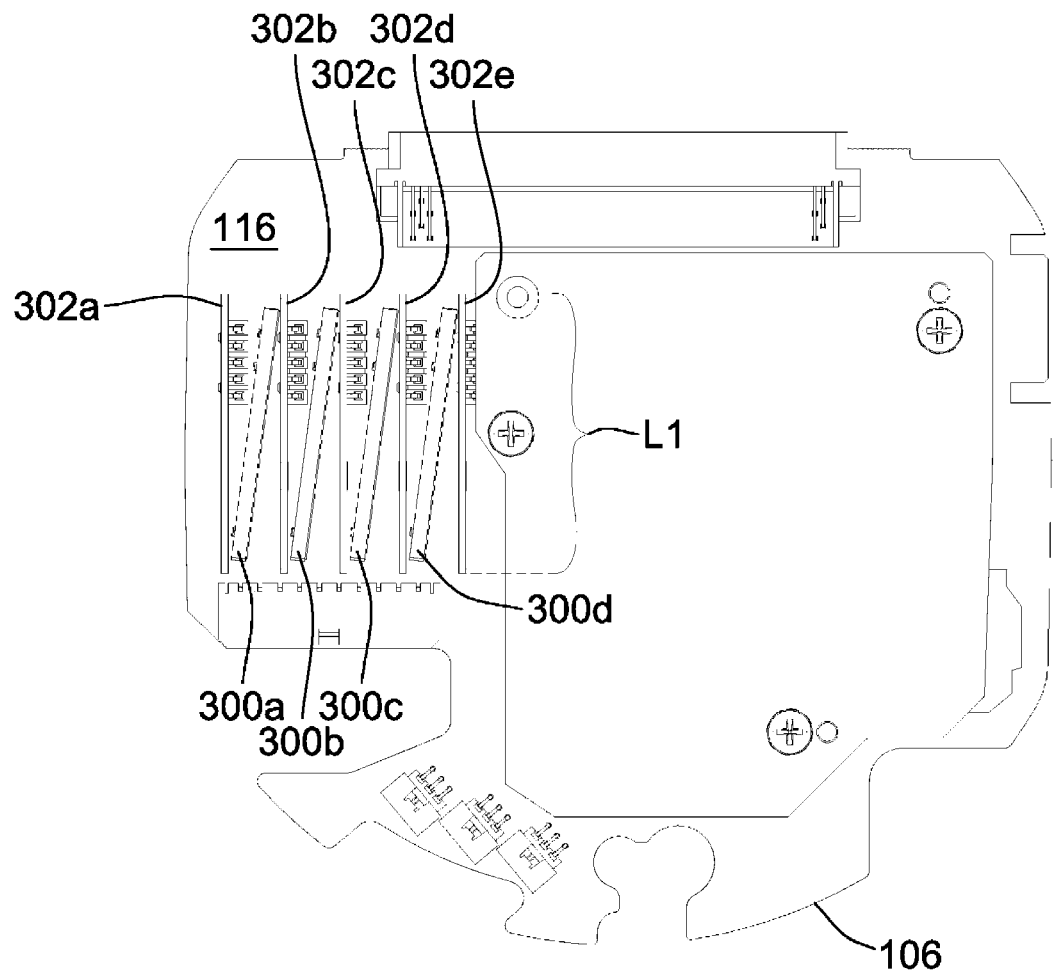
FIG. 3B is a top view of the main PCB shown in FIG. 3A.

The PCB shield assembly 108 includes at least two PCB shields 302a-b, or, as shown in FIG. 3A, five PCB shields 302a-e, depending on the number of resistors 300 used. For example, in a configuration in which two resistors 300a,b are used, three PCB shields 302a-c are used. As shown in FIG. 3A, because there are four voltage input resistors 300a-d, there are five PCB shields 302a-e, one on either end of the resistors 300a-d, and one in between each pair of resistors as can be seen from the top view of the main PCB 106 shown in FIG. 3B. Each PCB shield 302a,b,c,d,e includes a conductive layer 305 disposed within an electrically insulating dielectric substrate 306 as can be seen from the cross-sectional view of a PCB shield 302 in FIG. 3A-1. A height dimension, h1, of the PCB shield 302 is at least equal to a height dimension, h2, of the resistor 300 relative to the major surface 116 of the main PCB 106, such that h1>h2. The major surface of each of the PCB shields 302a-e has a length L1 (see FIG. 3B) that is at least as long as the length L2 of the major surface 308a-d of each of the resistors 300a-d, such that L1>L2.

The PCB shield 302 is secured to the main PCB 106 such that the resistor 300a is arranged between two major surfaces 304a,b of the PCB shield assembly 108. A distance between the resistor 300 and each of the two surfaces is less than a longest dimension of the resistor. The term "major surface," as used herein, refers to the largest contiguous surface relative to all of the surfaces of a particular component to which the major surface belongs. Each PCB shield 302 includes two major surfaces, one on either side of the PCB shield 302. A major surface 308a,b,c,d along the longest dimension, L2 (see FIG. 3A-2), of each of the resistors 300a,b,c,d is oriented relative to adjacent pairs of the PCB shields 302 in a non-parallel manner. In the illustration shown in FIG. 3B, the resistors 300a,b,c,d are oriented in a diagonal manner between adjacent pairs of the PCB shields 302a,b,c,d,e, such that each resistor-PCB-pair combination forms an N-shape (or a backwards N-shape depending on perspective). Orienting the resistors 300 relative to the PCB shield pairs 302 in this manner prevents the resistor 300 from physically moving. This orientation keeps the resistor pins from flexing and breaking. Also, since the capacitance is dependent on the distance between two conductive materials, fixing the distance between the resistor and PCB pair will produce a non-varying parasitic capacitance which can then be compensated for.

The length, L1 (see FIG. 3B), of the PCB shield 302 is at least as long as the length, L2, of the major surface of the resistor 300. Each of the PCB shields 302a,b,c,d,e includes a set of pins or one or more tabs that are soldered to a ground plane of the main PCB 106. They are intended to keep the PCB shields 302 fixed to the main PCB 106, in addition to connecting the conductive layers 305 inside each of the PCB shields 302a-e.

In the configuration illustrated in FIG. 3A, the outermost PCB shields 302a,e block unwanted electromagnetic energy produced by the power supply 112 located above the resistors 300, which will tend to emanate away from the power supply 112 and then circle back toward the main PCB 106, running along its major flat surface 116. Likewise, the internal PCB shields 302b,c,d located between each of the resistors 300a, b,c,d will block unwanted crosstalk energy between adjacent resistors. The field lines will be weaker at the exposed tops of each of the resistors 300a,b,c,d, so in some configurations, no further shielded is needed to protect the exposed tops of the resistors 300a-d.

A cover 310 (FIG. 3A) is disposed over the PCB shields 302a-e and the resistors 300a-d. The cover 310 can be made of any electrically insulating dielectric material. Optionally, a conductive layer can be incorporated within the cover 310 to provide further shielding against EMI from coupling over the tops of the resistors 300a-d. The cover 310 includes a first set of indentations 312a-e opposing a second set of indentations 314a-e offset from the first set of indentations 312a-e such that each of the indentations 312, 314 corresponds to a space between the resistor and respective ones of the PCB shields. The offset is necessary because the resistors 300a-d are arranged diagonally relative to each of the PCB shields 302a-e. The cover 310 is used to keep the resistors 300 and the PCB shields 302 securely in place on the main PCB 106, and can also be used to further shield the resistors 300 against EMI produced by the power supply 112 or other EMI-producing components within the power meter 100. The cover 310 also protects any protruding pins from the nearby second PCB 110 from contacting any part of the resistors 300, providing an additional level of protection to the voltage input resistors 300.

Figure 2:
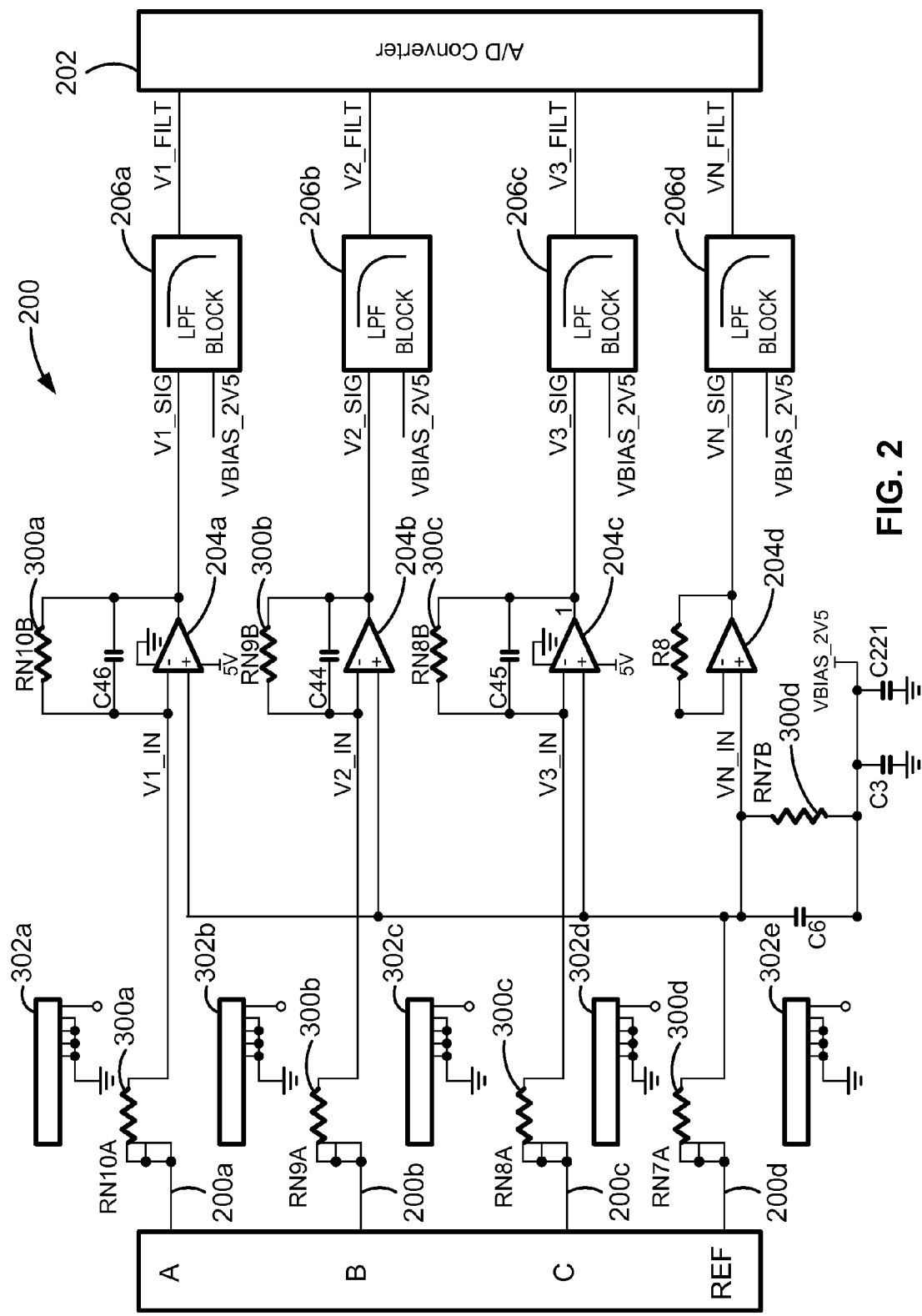
FIG. 2 is a schematic of example circuitry involved in converting the input voltages to corresponding digital values.

FIG. 2 is a schematic illustration of a digital conversion circuit 200 on the main PCB 106. The digital conversion circuit 200 converts voltages being monitored by the power meter 100 into corresponding digital values in the A/D converter 202. The circuit 200 receives four voltage inputs, labeled A, B, C, and REF in FIG. 2, and numbered 200a,b,c,d, respectively. The first three voltage inputs A, B, and C, correspond to different phases of the input voltage being monitored by the power meter, and these phases are typically labeled as A, B, and C, each one lagging or leading the other by 120 degrees. The resistors 300a,b,c,d are physically housed in a package, which in the example shown in FIG. 3A has a generally rectangular shape, with at least one resistor in the package. For example, the resistor 300a includes a voltage input resistor RN10A, having a value of 5 MΩ, and a feedback resistor RN10B, having a value of 13 kΩ. Similarly, the resistor 300b includes a voltage input resistor RN9A, having a value of 5 MΩ, and a feedback resistor RN9B, having a value of 13 KΩ. The resistor 300c includes a voltage input resistor RN8A, having a value of 5 MΩ, and a feedback resistor RN8B, having a value of 13 KΩ. The resistor 300d includes a voltage input resistor RN7A, having a value of 5 MΩ, and a voltage divider resistor RN7B, having a value of 13 KΩ. These values are exemplary only, and as mentioned above, the values of the voltage input resistors should be set to a value sufficient to range the input voltage from the line(s) to which the power meter 100 is connected to values acceptable to be input into the A/D converter 202. By incorporating the feedback resistors RN10B, RN9B, RN8B, and RN7B into the same package as the voltage input resistors RN10A, RN9A, RN8A, and RN7A, the amplifier outputs are less susceptible to relative changes in value due to temperature or time.

The voltages present at the inputs 200a,b,c,d are reduced, commensurate with the value of the resistors 300a,b,c,d, to corresponding input voltages V1_IN, V2_IN, V3_IN, and VN_IN, which are received at respective amplifiers 204a,b,c,d. The amplifiers 204a,b,c,d amplify the corresponding input voltages to produce amplified input voltages, labeled V1_SIG, V2_SIG, V3_SIG, and VN_SIG. The amplified input voltages are received by corresponding low-pass filter blocks 206a,b,c,d to produce filtered input voltages V1_FILT, V2_FILT, V3_FILT, and VN_FILT. These filtered input voltages are received by the A/D converter 202, which conventionally convert the input voltages to corresponding digital values indicative of the original voltages received on inputs 200a,b,c,d.

As mentioned above, even though four resistors 300a-d are shown in the drawings, the present disclosure is not limited to four-resistor configurations. For example, in a three-resistor configuration, three high-value precision resistors, such as resistors 300a-c, are disposed on the main PCB 106 and electrically coupled to corresponding inputs, such as inputs 200a-c, to the power meter 100. Each of the inputs 200a,b,c carry different phases of a current or a voltage being measured by the power meter 100. The PCB shield assembly 108 includes four (instead of five used in the four-resistor combination) PCB shields, such as the PCB shields 302a,b,c,d each having a conductive layer 305 disposed within an electrically insulating dielectric substrate 306 and arranged on the main PCB 106 such that each of the at three resistors 300a,b,c is arranged between at least a pair of the PCB shields 302 to minimize crosstalk between adjacent resistors. A major surface 308 a,b,c of each of the three resistors 300a,b,c is oriented in a non-parallel manner relative to a major surface of adjacent pairs of the PCB shields 302a,b,c,d, which face the respective resistors 300a,b,c. For example, as shown in FIG. 3A, the resistors 300a,b,c are arranged in a diagonal manner between adjacent pairs of the PCB shields 302a,b,c,d such that each resistor-PCB-shield-pair combination forms a generally N shape (or backwards N shape).

Figure 4:
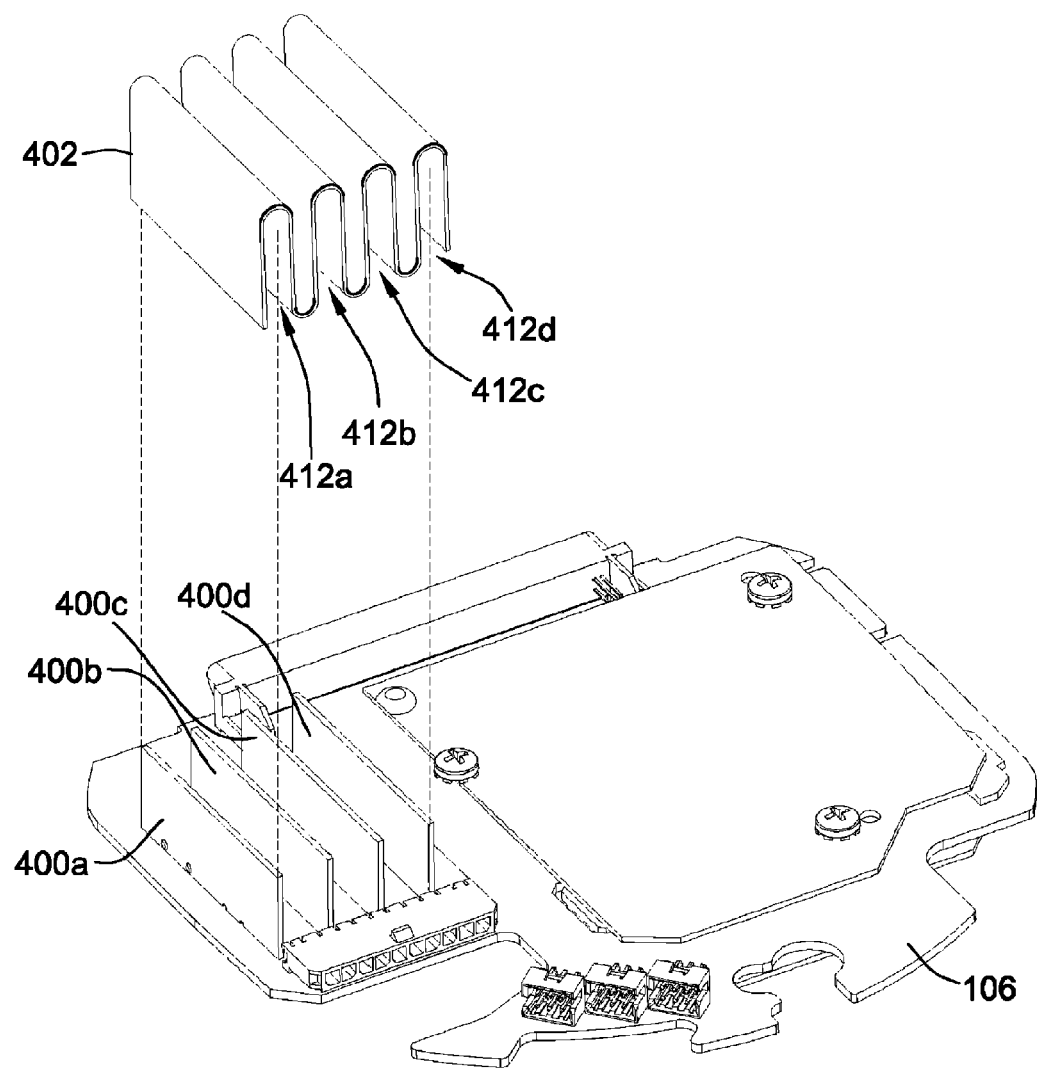
FIG. 4 is a perspective view of a top surface of a main printed circuit board having a flexible PCB shield according to an aspect of the present disclosure.

Turning now to FIG. 4, a single, flexible PCB shield 402 is shown instead of five separate PCB shields 302a-e shown in FIG. 3A. Like each of the PCB shields 302a-e, shown in FIG. 3A-1, the flexible PCB shield 402 includes a flexible conductive material, such as copper, sandwiched between an insulating dielectric material or substrate so that the conductive material acts as a shield to protect the resistors 400a-d against unwanted energies due to electromagnetic interference produced by the power supply 112 or due to crosstalk from adjacent phase(s). The resistors 400a-d are just like the resistors 300a-d shown and described in connection with FIGS. 3A-3B, except that the resistors 400a-d are arranged parallel to one another so that each resistor 400a,b,c,d can be received within corresponding U-shaped spaces 412a,b,c,d formed in the serpentine-shaped, flexible PCB shield 402. Each U-shaped portion 412a,b,c,d of the flexible PCB shield 402 extends over the tops of each of the resistors 400a,b,c,d and in between each adjacent pair of resistors 400. By snaking over and in between each of the resistors 400, the flexible PCB shield 402 operates to protect the resistors 400 like the cover 310 shown in FIG. 3A against protruding pins from the second circuit board 110 located above the flexible PCB shield 402 and to shield the resistors 400 on all exposed sides against unwanted energies, such as EMI energy from other electronic components within the power meter 100 or crosstalk energy from adjacent phases. Alternately, instead of snaking the flexible PCT shield 402 over and in between each of the resistors 400, the flexible PCT shield 402 can snake around the sides of and in between each of the resistors 400.

Figure 5A:
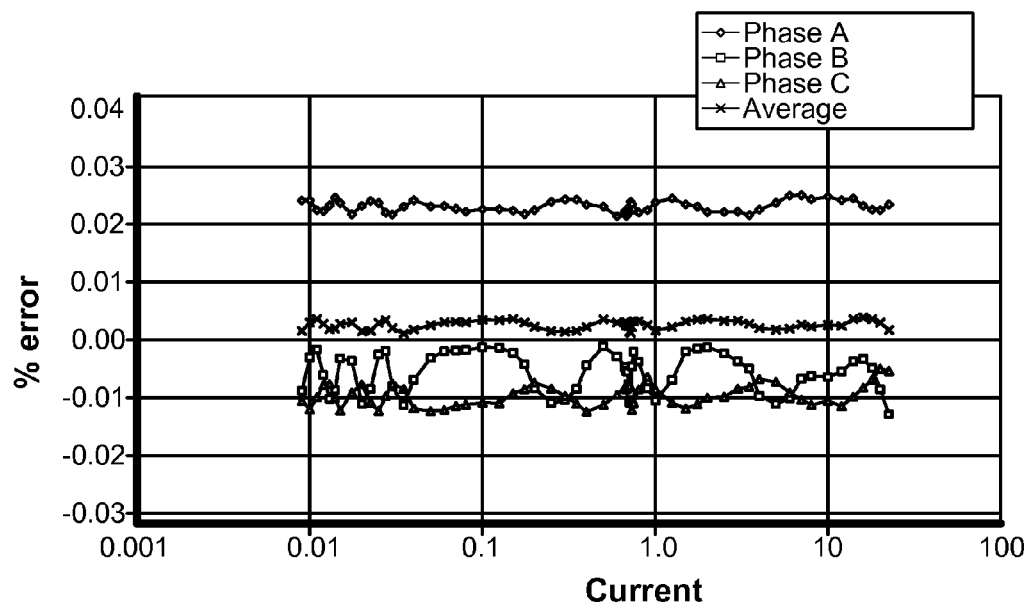
FIG. 5A is a chart showing the percent error when a constant voltage is applied to the inputs while a range of phase currents are applied to a power meter without the PCB assembly according to the present disclosure.
Figure 5B:
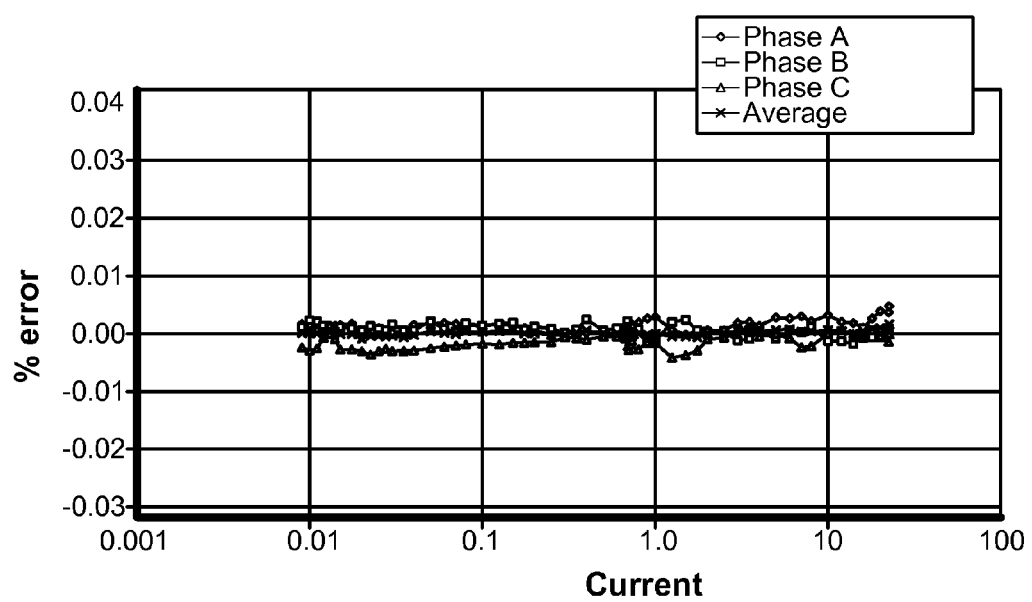
FIG. 5B is a chart showing the percent error when a constant voltage is applied to the inputs while a range of phase currents are applied to a power meter having a PCB assembly according to the present disclosure.

Turning now to FIGS. 5A and 5B, two plots are illustrated comparing the variability in percent error seen by each voltage phase input to a power meter without the PCB shield assembly 108 described in the present disclosure (FIG. 5A), against the variability in percent error seen by each voltage phase input to the power meter 100 with the PCB shield assembly 108 described herein (FIG. 5B). In FIGS. 5A and 5B three voltage phases, A, B, C were measured downstream of the input resistors to the power meter and being monitored by the power meter and being compared against an external reference. The plot shows current on the x-axis because these voltage measurements were taken while various currents were being applied on each of the three current phases (not shown on the plots) over the course of approximately 10 minutes. This effectively shows a plot of voltage phase error over time. In FIG. 5A, the percent error on the y-axis is caused by EMI and resistor crosstalk, resulting in the percent error for one of the phases always exceeding 0.01%, and the other two phases changing in magnitude of error over the course of the test. This test was conducted where the input voltage was held at 120V at 60 Hz, 25 degrees C., using a 0.5 power factor (PF).

The second plot shown in FIG. 5B was taken under the same test conditions as those for the plot shown in FIG. 5A, except that now the PCB shield assembly 108 shown in FIG. 3A is installed. With the PCB shield assembly 108 installed, a dramatic reduction in the percent error and the variations in error during the test can be seen. All three phases consistently exhibit a percent error of less than 0.005%.

Although the illustrated examples above have been described in connection with a power meter 100, aspects of the present disclosure can be applied to any electronic device having electronic components susceptible to interference due to electromagnetic energy produced by other electronic components within the device and/or to crosstalk interference due to nearby electronic components.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of the invention as defined in the appended claims.

What is claimed is:

1. A printed circuit board assembly for use in a power meter, comprising:
   a main printed circuit board;
   at least one high-value precision resistor disposed on the main printed circuit board and electrically coupled to a corresponding input to the power meter, the input carrying a current or a voltage being measured by the power meter; and
   a printed circuit board (PCB) shield assembly having a conductive layer disposed within an electrically insulating dielectric substrate, at least a portion of the PCB shield assembly being secured to the main printed circuit board such that the resistor is arranged between two surfaces of the PCB shield assembly such that a distance between the resistor and each of the two surfaces is less than a longest dimension of the resistor.

2. The assembly of claim 1, wherein a major surface along the longest dimension of the resistor is oriented relative to the two surfaces of the PCB shield in a non-parallel manner.

3. The assembly of claim 1, wherein a length of each of the two surfaces is at least as long as a length of the major surface of the resistor.

4. The assembly of claim 1, wherein the at least one resistor includes at least three high-value precision resistors disposed on the main printed circuit board and electrically coupled to corresponding inputs to the power meter, each of the inputs carrying different phases of a current or a voltage being measured by the power meter, and wherein the PCB shield assembly includes at least four PCB shields each having a conductive layer disposed within an electrically insulating dielectric substrate and arranged on the main printed circuit board such that each of the at least three resistors is arranged between at least two of the PCB shields to minimize crosstalk between adjacent ones of the resistors, a major surface of each of the at least three resistors being oriented relative to a major surface of adjacent pairs of the at least four PCB shields in a non-parallel manner.

5. The assembly of claim 4, wherein the at least three resistors includes at least a fourth high-value precision resistor disposed on the main printed circuit board and electrically coupled to a reference current or voltage, and wherein the at least four PCB shields includes at least a fifth PCB shield arranged on the main printed circuit board such that each of the at least four resistors is arranged between at least two of the PCB shields, a major surface of each of the at least four resistors being oriented relative to a major surface of adjacent pairs of the at least five PCB shields in a non-parallel manner, and wherein the at least five PCB shields are parallel to each other.

6. The assembly of claim 5, wherein the major surface of each of the PCB shields has a length that is at least as long as a length of the major surface of each of the resistors.

7. The assembly of claim 4, wherein each of the inputs are voltage inputs carrying different phases of a voltage being measured by the power meter.

8. The assembly of claim 5, further comprising a cover that is disposed over the at least five PCB shields and the at least four resistors, the cover including a first set of indentations opposing a second set of indentations offset from the first set of indentations such that each of the indentations corresponds to a space between the resistor and respective ones of the PCB shields.

9. The assembly of claim 1, wherein a value of the resistor is in the order of mega-ohms.

10. The assembly of claim 1, wherein the substrate of the PCB shield assembly is flexible, at least a portion of the flexible substrate of the PCB shield assembly extending over a top of the resistor.

11. The assembly of claim 10, wherein the portion has a generally U-shape.

12. The assembly of claim 10, wherein the at least one resistor includes at least three high-value precision resistors disposed on the main printed circuit board and electrically coupled to corresponding inputs to the power meter, each of the inputs carrying different phases of a current or a voltage being measured by the power meter, and wherein the flexible substrate extends over and between each of the at least three resistors.

13. The assembly of claim 12, wherein the substrate has a generally serpentine shape.

14. The assembly of claim 1, further comprising a power supply that supplies power to electronic components on the main printed circuit board, a major surface of the second printed circuit board being parallel to a major surface of the main printed circuit board, the PCB shield assembly minimizing interference on the resistor due to energy emitted from the power supply.

15. A power meter, comprising:
   a housing;
   a main printed circuit board arranged within the housing;
   at least one high-value precision resistor disposed on the main printed circuit board and electrically coupled to a corresponding input to the power meter, the input carrying a current or a voltage being measured by the power meter;
   a printed circuit board (PCB) shield assembly having a conductive layer disposed within an electrically insulating dielectric substrate, at least a portion of the PCB shield assembly extending above or over the resistor and is secured to the main printed circuit board such that the resistor is arranged between two surfaces of the PCB shield assembly such that a distance between the resistor and each of the two surfaces is less than a longest dimension of the resistor; and a power supply that supplies power to electronic components on the main PCB, the power supply being arranged within the housing in a stacked relationship relative to the main PCB, the PCB shield minimizing interference on the resistor due to energy emitted from the power supply.

16. The power meter of claim 15, further comprising a second printed circuit board on which the power supply is disposed, a major surface of the second PCB being parallel to a major surface of the main PCB.

* * * * *